United States Patent
Khouri et al.

(10) Patent No.: US 6,816,001 B2
(45) Date of Patent: Nov. 9, 2004

(54) LOW POWER CHARGE PUMP CIRCUIT (75) Inventors: Osama Khouri, Milan (IT); Andrea Pierin, Graffignana (IT); Dario Soltesz, Gioia Del Colle (IT); Guido Torelli, Sant'Alessio con Vialone (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/290,030

(22) Filed: Nov. 7, 2002

(65) Prior Publication Data
US 2003/0107428 A1 Jun. 12, 2003

(30) Foreign Application Priority Data
Nov. 9, 2001 (EP) .................................. 01830695

(51) Int. Cl.[7] .................................................. G05F 1/46
(52) U.S. Cl. .......................... 327/536; 363/60; 365/227
(58) Field of Search .............................. 327/535, 536; 363/59, 60; 365/189.09, 227

(56) References Cited

U.S. PATENT DOCUMENTS 5,301,097 A    4/1994  McDaniel ................... 363/60
5,969,565 A  * 10/1999 Naganawa ................. 327/536
6,278,317 B1 *  8/2001 Hsu et al. .................. 327/536
6,486,728 B2 * 11/2002 Kleveland .................. 327/536
2002/0175745 A1 * 11/2002 Kim .......................... 327/536
2003/0058029 A1 *  3/2003 Matsui ....................... 327/536

FOREIGN PATENT DOCUMENTS

EP    0 716 368 A1    6/1996
EP    1 111 763 A2    6/2001

* cited by examiner

Primary Examiner—Timothy P. Callahan
Assistant Examiner—Terry L. Englund
(74) Attorney, Agent, or Firm—Lisa K. Jorgenson; Dennis M. de Guzman; Seed IP Law Group PLLC (57) ABSTRACT A charge pump circuit, connected between a first voltage reference and an output terminal, comprises at least two parallel-coupled stages having an elementary charge pump circuit connected between said first voltage reference and said output terminal, and adjustment circuitry connected between said output terminal and respective control terminals of said at least two stages. This adjustment circuitry is arranged to select for actuation an appropriate combination of these elementary stages according to the current absorbed from a load connected to the output terminal.

21 Claims, 7 Drawing Sheets

LOW POWER CHARGE PUMP CIRCUIT

FIELD OF THE INVENTION

The present invention relates to a low power consumption charge pump circuit.

Specifically, the invention relates to a charge pump circuit that is connected between a first voltage reference and an output terminal.

The invention further relates to a method of generating a substantially constant voltage signal whose value exceeds a supply voltage reference.

The invention relates, particularly but not exclusively, to a charge pump circuit for low power applications, this description covering that field for convenience of illustration only.

DESCRIPTION OF THE RELATED ART

As is well known, extensive use is made nowadays of nonvolatile digital data memory devices. Consumer products, such as still and TV cameras, "walkmen," cellular phones, and electronic notebooks, require this kind of memory devices for storing information in a compact support of large capacity.

A shortcoming of nonvolatile memory devices is the high power consumption that associates with their operation. This is obviously of major consequence to portable products like those listed above, which have to be battery powered.

Most of the power expended to operate such memories goes to charge pump circuits, which are arranged to raise the voltage value above the supply (usually, battery) level for further supplying a part of the circuitry integrated in the memory device. This is because the voltages needed to perform such basic operations as program and erase operations in nonvolatile memory devices, and in low voltage supply circuits read operations as well, are higher than the supply voltage.

Thus, providing charge pump circuits that would absorb as little as possible on the power supply for their operation is quite important, and the present trend toward ever lower supply voltages for integrated circuits can only emphasize this importance.

Figure 1:
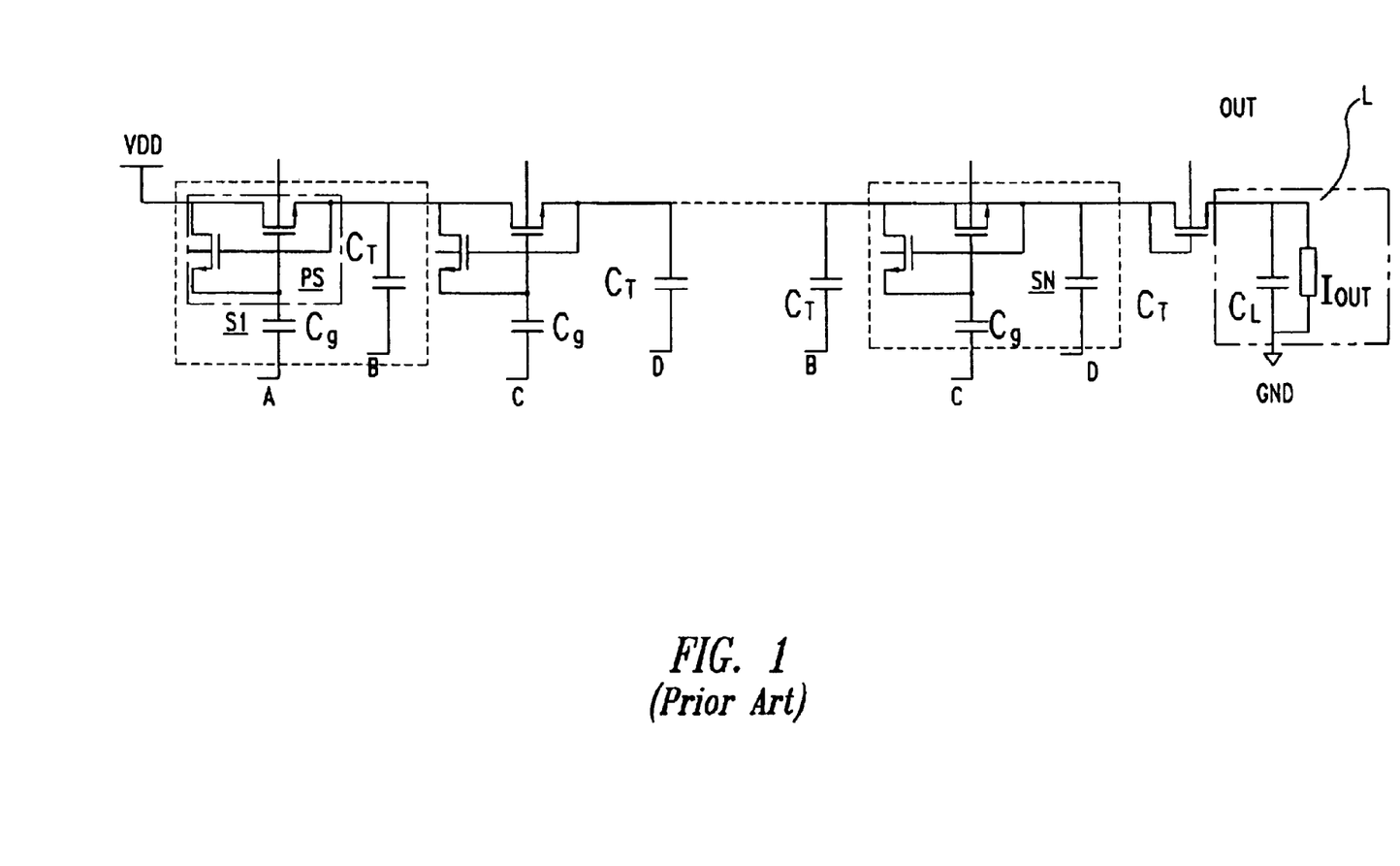
FIG. 1 shows a charge pump circuit according to the prior art.

A standard charge pump circuit for nonvolatile memory chips is shown in FIG. 1, that illustrates a known charge pump of the Dickson type.

This charge pump comprises a plurality of stages S1–SN, which are connected in cascade between an input node that is connected to a voltage supply line VDD, and an output node. The output node is connected to a load L represented by a capacitor having a capacitance $C_L$ and being connected in parallel with a current-absorbing element $I_{OUT}$ connected between said output node and a reference GND. Each stage comprises a charge transfer element PS comprising of a pass transistor that has its gate terminal driven by appropriate drive signals, and a transfer capacitor of capacitance $C_T$ having one plate connected to the transfer element PS and the other plate connected to a drive signal A, B, C, D.

Two equations are related with the circuit of FIG. 1 which link the circuit output voltage $V_{OUT}$ and the current $I_{IN}$ absorbed from the supply reference to variation of the current $I_{OUT}$ that the circuit is to supply to the load:

$$V_{OUT} = (n+1)V_{DD} - n\frac{I_{OUT}}{fC_T} = V_{OUT,MAX} - R_{OUT}I_{OUT} \quad (1)$$

$$I_{IN} = (n+1)I_{OUT} + nfC_{PAR}V_{DD} \quad (2)$$

where:
n is the number of stages used in the charge pump;
$I_{OUT}$ is the output current, i.e., the current absorbed from the load;
$V_{DD}$ is the supply voltage;
$C_T$ is the capacitance of the transfer capacitors;
$C_{PAR}$ is the capacitance of a parasitic capacitor of the bottom plate of each transfer capacitor; and
$f$ is the frequency of the clock signal (i.e., the switching frequency of the drive signals A, B, C, D to the charge pump).

The single parasitic effect considered in equation (2) is that due to the parasitic capacitance that exists between the bottom plates of the transfer capacitors of capacitance $C_T$ and the ground reference GND. This, of course, is inclusive of the parasitic capacitance of the lines connected to this plate, which capacitance is usually much lower than the parasitic capacitance of the plate itself. In particular, the parasitic capacitances associated with the internal nodes of the charge pump, such as the capacitance of the top plates of the capacitors and the parasitic capacitances associated with the capacitors Cg and the other charging elements PS, are neglected in Equations (1) and (2).

In particular, it is evinced from Equation (1) that the loadless output voltage $V_{OUT,MAX}$, i.e., the current absorbed from the load L is zero, of the charge pump is $V_{OUT,MAX} = (n+1)V_{DD}$, and the loadless output resistance $R_{OUT}$ is n/fCr.

Equation (1) shows that. if a current $I_{OUT}$ is to be delivered with the output voltage $V_{OUT}$ held at or above a predetermined value, a minimum of stages must be used. Also, to minimize the voltage drop due to the charge pump circuit delivering the current $I_{OUT}$, a high frequency and large transfer capacitors must be used.

However, the last-mentioned requirement collides with the provisions of Equation (2) because, as the capacitance CT of the transfer capacitors increases, the value $C_{PAR}$ of the parasitic capacitances also increases, and with it the current $I_{IN}$ absorbed from the power supply. The same consideration applies to the frequency $f$.

Accordingly, the charge pump circuits are at once required to deliver the necessary current to the load, to hold the output voltage at an adequate level, and to absorb the lowest possible amount of current $I_{IN}$ from the power supply.

This is particularly true when the charge pump is used for driving a load whose absorption of the current $I_{OUT}$ varies conspicuously with time. To provide a desired value of the output voltage $V_{OUT}$ at a large value of the current $I_{OUT}$, the product $fC_T$ has to be sufficiently high. With such a pump, when the current $I_{OUT}$ absorbed from the load is small, the output voltage $V_{OUT}$ approaches its maximum $V_{OUT,MAX}$ (corresponding to the loadless voltage value). The drop due to the term $I_{OUT}/fC_T$ is thus minimized.

Under these conditions, the voltage value $V_{OUT}$ is high, although a lower output voltage value $V_{OUT}$ would be sufficient to ensure proper performance of the whole circuit. Thus, it makes no sense to keep the charge pump at the top of its capacity under such conditions, while it could be operated at lower levels and reduced power absorbed from the power supply, i.e., at a lower value of $fC_T$.

A first prior approach to reach this requirement provides for on/off control of the output voltage $V_{OUT}$, i.e., the charge pump turns off as soon as the output voltage reaches a higher preset threshold value, and turns on again as the output voltage falls below this value.

Despite its simple design, this approach has a drawback in that, at each working cycle of the drive signals, a predetermined charge amount $\Delta Q$ is output. As said before, if the charge pump circuit is sized to provide a desired output voltage level $V_{OUT}$ when there is a high output current $I_{OUT}$, the charge amount $\Delta Q$ will be adequately large, because the charge amount $\Delta Q$ equals the amount of charge absorbed by the load L during one cycle of the drive signals A–D. Thus, as the control loop by which the charge pump is turned on/off operates the charge pump, the output voltage $V_{OUT}$ will experience a manifest increase. This increase is then cancelled, in time interval, by the absorption from the load L. This produces substantial rippling of the output voltage $V_{OUT}$.

The ripple is the more manifest when some delay occurs in the control loop. In this case, the charge pump may stay 'on' for some time even if the output voltage $V_{OUT}$ exceeds the preset threshold level, so that the ripple amplitude is increased.

A prior embodiment based on the on/off control technique provides for the capacitance $C_T$ of the transfer capacitors to vary with the current $I_{OUT}$ absorbed from the load. This requires the availability of a DPCA (Digital Programmable Capacitor Array), i.e., sets of cascaded capacitors adapted for independent activation. However, where high operating voltages are involved, high-voltage capacitors must be used, i.e., capacitors that can withstand large electric fields between their plates. By reason of their construction, such capacitors exhibit large parasitic capacitances between their bottom plates and ground. With the bottom plates of the capacitors connected to the drive signals, this leads to a large dissipation of power according to Equation (2). Also, the connection of the bottom plate to the internal node of the charge pump causes the capacitive partition ratio of the individual stages to be exceedingly low, thus draining a significant portion of the charge on the internal nodes of the charge pump to ground and reducing the maximum attainable value $V_{OUT,MAX}$ of the output voltage.

Furthermore, high-voltage switches must be provided for selecting the DPCA capacitors, these switches taking up a large amount of silicon area and having large parasitic capacitances.

A second prior approach to the problem of controlling power consumption of the charge pump provides for the output voltage to be controlled by adjusting the frequency of the clock signal.

However, not even this approach is devoid of shortcomings, although it does provide a smoother output voltage. Since the capacitance $C_T$ of the transfer capacitor must be large when the current absorption from the load L is small, the output voltage $V_{OUT}$ is once again rippled (due to that the charge amount $\Delta Q$ may be too large during a single cycle of the drive signals).

The underlying technical problem of this invention is to provide a charge pump circuit with appropriate structural and functional features to lower power consumption both in operation and standby, i.e., when no current is absorbed by the charge pump output (standby), thereby overcoming the drawbacks that beset prior art circuits.

BRIEF SUMMARY OF THE INVENTION

The resolutive idea which is at the basis of this invention is that of providing a charge pump that comprises a parallel of at least two elementary charge pump circuits, wherein the charge pump is able to sense the current $I_{OUT}$ absorbed from the load connected thereto, and accordingly select the best combination of elementary charge pump circuits for each absorbed current $I_{OUT}$.

Based on this principle, the technical problem is solved by a circuit as indicated, and as defined in claim 1.

The problem is further solved by a method as previously indicated, and as defined in claim 10.

The features and advantages of the device according to the invention will be apparent from the following detailed description of an embodiment thereof, given by way of example and not of limitation with reference to the accompanying drawings.

DETAILED DESCRIPTION OF THE INVENTION

Embodiments of a low power charge pump circuit are described herein. In the following description, numerous specific details are given to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 2:
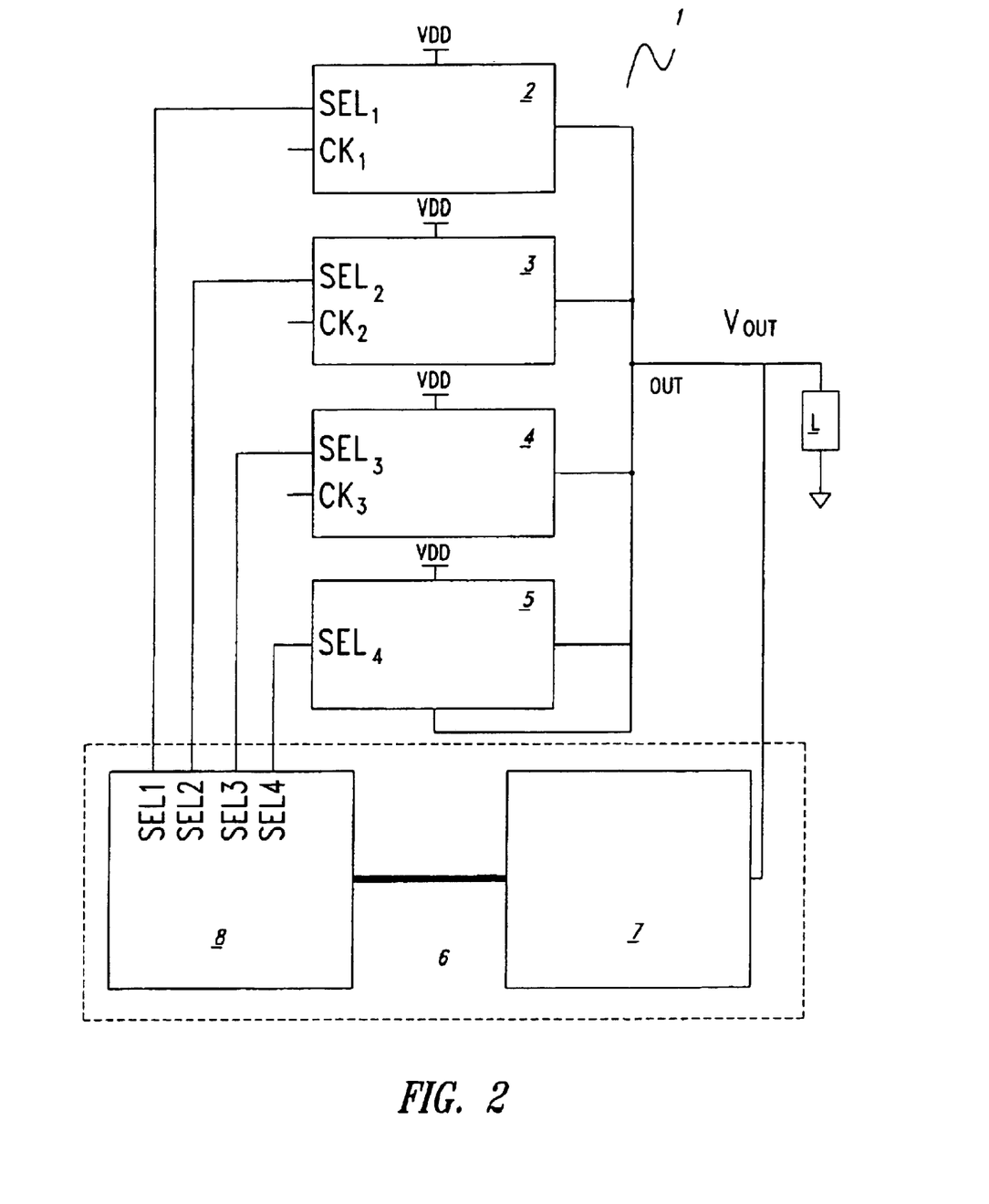
FIG. 2 shows a block diagram of the charge pump circuit according to an embodiment of the invention.

With reference to the drawings, in particular to the example of FIG. 2, a charge pump circuit realized according to an embodiment this invention is generally shown at 1 in schematic form. The charge pump circuit can be used. i.e., in integrated memory device.

The circuit 1 of this invention comprises a plurality n of stages connected together in parallel between a supply voltage reference $V_{DD}$ and an output terminal OUT.

A control circuit 6 is connected between the output terminal OUT of the circuit 1 and the input of each stage, to provide respective select/enable signals SEL1, SEL2, . . . , SEL4 to the stages. According to the invention, the control circuit 6 is adapted to select for activation a suitable combination of these elementary stages according to a current absorbed by a load connected to the output terminal OUT.

In one embodiment, herein described and illustrated by way of non-limitative example, the circuit 1 comprises four stages 2, 3, 4, 5, each incorporating a conventional elementary charge pump circuit. However, nothing prevents providing only two such stages.

Each stage of the first three 2, 3, 4 has a terminal to which synchronization (clock) signals CK1, . . . , CK3 are connected. Advantageously, these clock signals CK1, . . . , CK3 are connected to a common signal. In particular, according to an embodiment of the invention, these stages 2, 3, 4 are driven by clock signals CK1, . . . , CK3 that have all the same frequency and are derived from one signal, referred to as the master clock signal, through a conventional enable/disable network. However, nothing prevents these clock signals CK1, . . . , CK3 from all being different.

Figure 3:
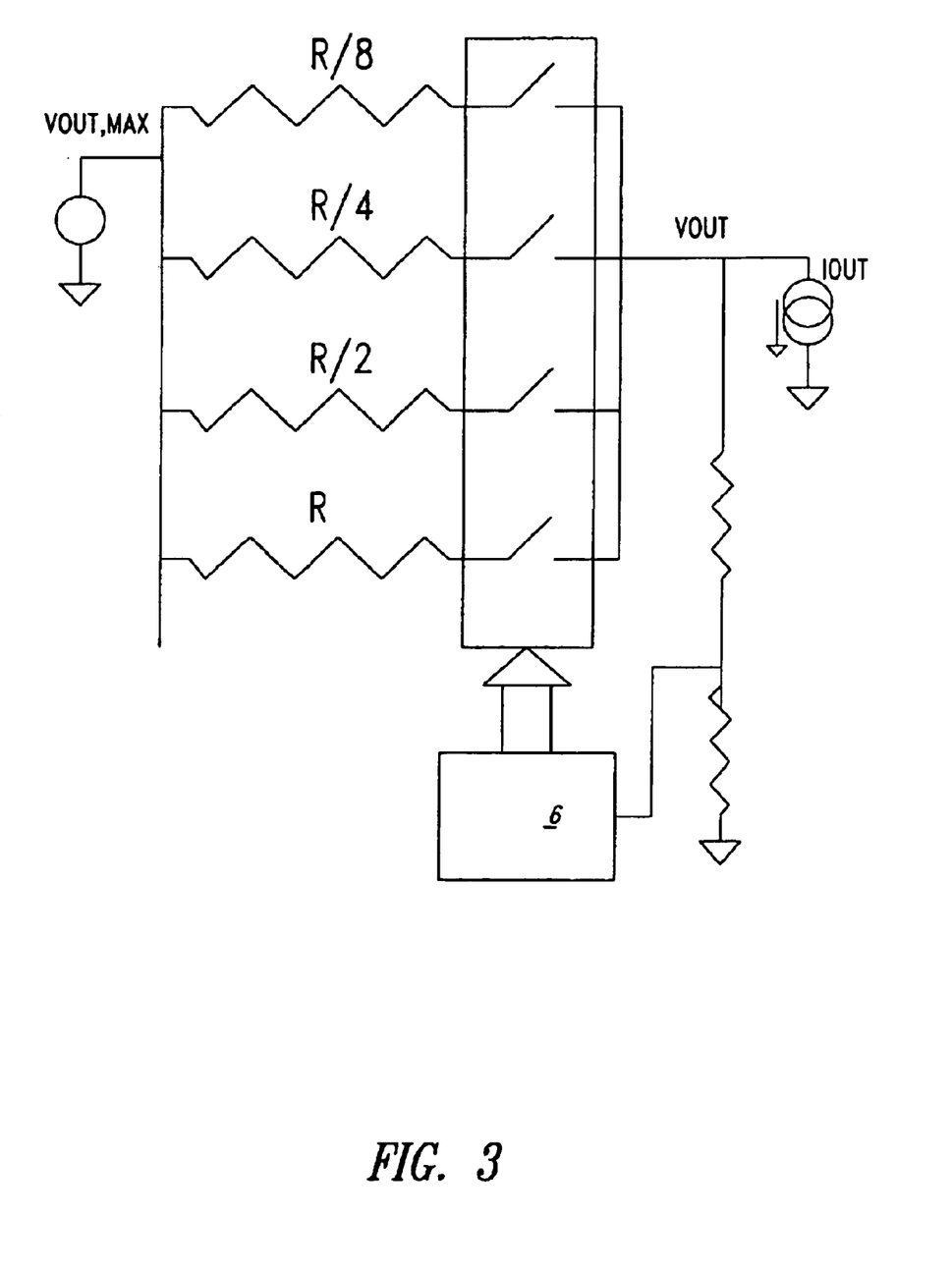
FIG. 3 shows a schematic equivalent circuit diagram of the charge pump circuit according to an embodiment of the invention.

According to an embodiment of the invention, the stages 2, 3, 4, 5 comprise charge pumps having the same loadless output voltage ($V_{OUT,MAX}$) and different output resistances, as schematically illustrated by the equivalent circuit of FIG. 3.

In one embodiment of the circuit 1 according to the invention, the stages 2, 3, 4, 5 comprise each at least one conventional charge pump circuit of the pass transistor type, with each of these circuits including transfer capacitors of a different size from those of the other blocks.

In particular, the first stage 2 comprises a charge pump circuit having transfer capacitors of a capacitance CT', the second stage 3 a charge pump circuit having transfer capacitors of a capacitance CT'/2, the third stage 4 a charge pump circuit having transfer capacitors of a capacitance CT'/4, and the fourth stage 5 a charge pump circuit having transfer capacitors of a capacitance CT'/8. The four stages 2, 3, 4, 5 deliver their charge to the single output terminal OUT, and may be operated in parallel.

Advantageously, the stage 5 comprises a pass-transistor elementary charge pump circuit, wherein the clock signal is provided by a voltage-controlled oscillator (VCO). In this stage 5, the control signals (and, hence, the frequency of the output signal) are dependent on the pump output voltage. However, nothing prevents the other stages 2, 3, 4 could also be provided with a voltage-controlled oscillator VCO, instead of being connected to the same clock signal, with the clock signal CK1, . . . , CK3 being fixed.

Figure 4:
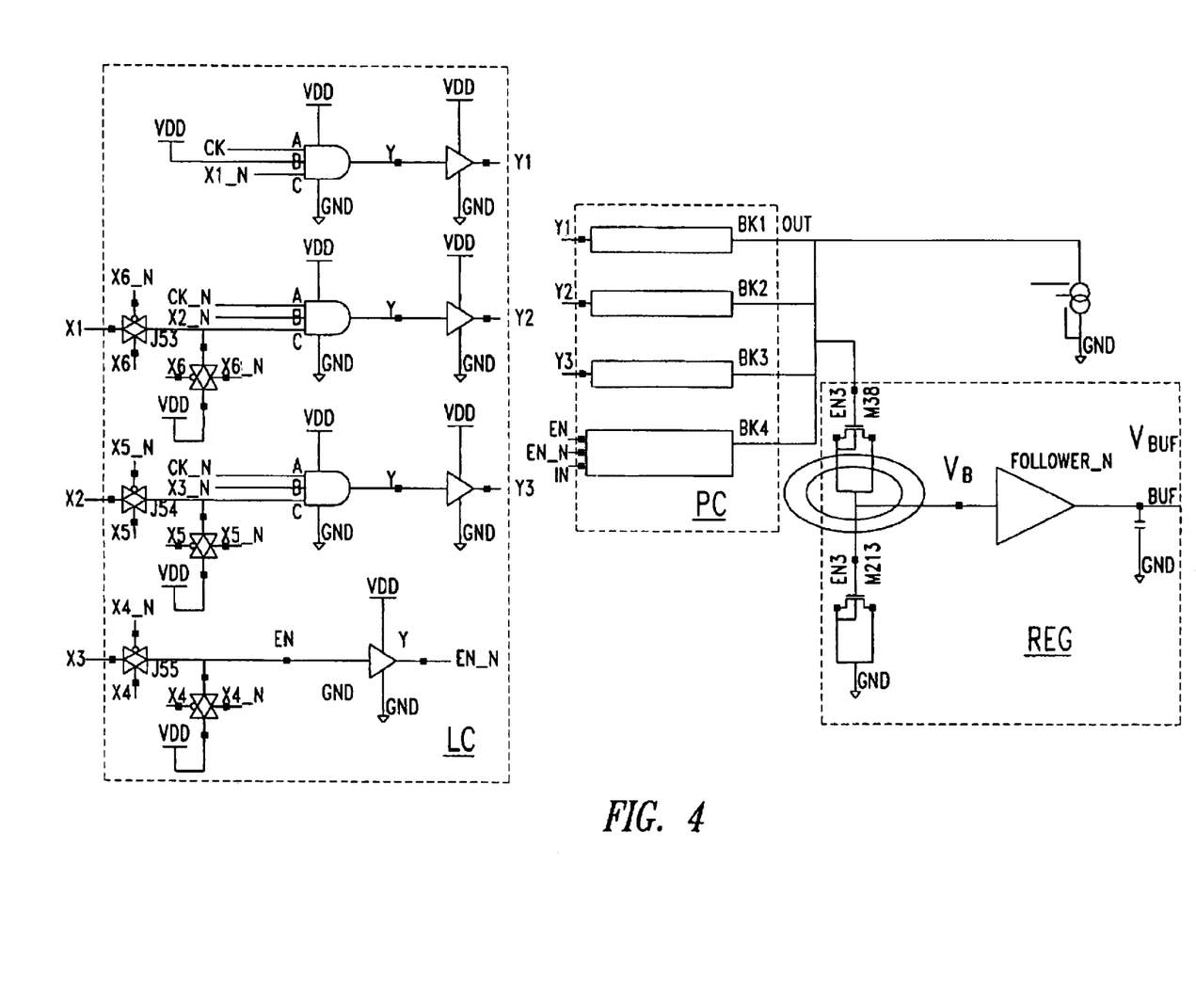
FIGS. 4 and 5 show a possible embodiment of the charge pump circuit shown in FIG. 2.

A possible embodiment of such stages is shown in FIG. 4 as a block PC that contains the four charge pump circuits of the stages 2, 3, 4, 5.

The control circuit 6 of FIG. 2 may comprise an analog-to-digital converter 7 and selection logic 8, for example.

In particular, the converter 7 will produce logic control signals for controlling the output voltage $V_{OUT}$, as this voltage varies at the output terminal OUT.

Figure 5:
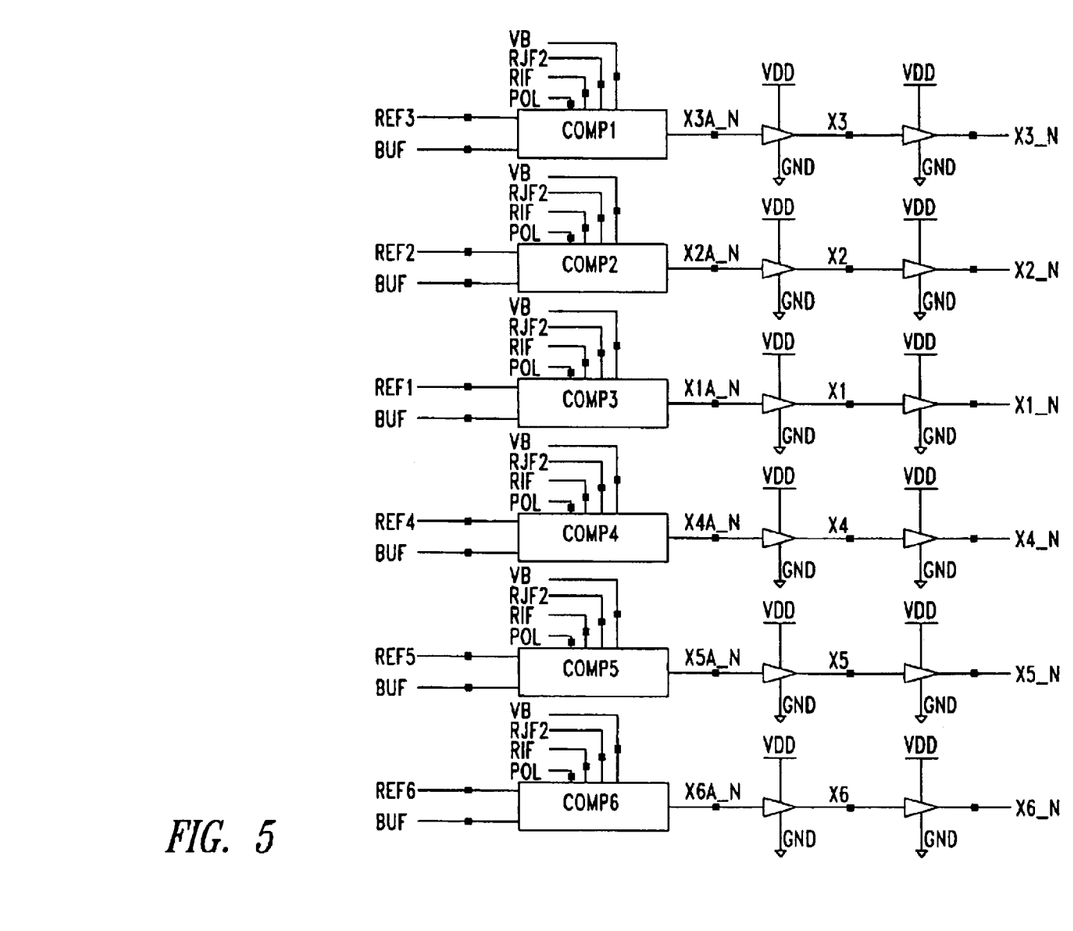

Referring to FIGS. 4 and 5, in a non-limitative example, the converter 7 comprises a first section REG and a second section COMP. The first section REG comprises a voltage divider arranged to reduce the output voltage $V_{OUT}$ to a value $V_B$ within a reference range, for instance between ground voltage GND and supply voltage $V_{DD}$. This voltage $V_B$ is input to the second section COMP of FIG. 5 through a voltage repeater. The second section COMP comprises a plurality of comparators. These comparators are to compare the output voltage $V_{BUF}$ from the voltage repeater with predetermined reference voltages $V_{REF1}$, . . . , $V_{REF6}$ and output an appropriate logic signal. In the embodiment of FIG. 5, these logic signals are designated X1, X2, X3, X4, X5, X6.

The selection logic 8 will select one or more of the charge pump circuits in the stages 2, 3, 4, 5 for activation, according to the logic signals that are generated by the converter 7. In a typical configuration, a pump would be activated by enabling its drive signals, and deactivated by disabling its drive signals, i.e., holding them at a fixed level. A possible embodiment of this activation logic is illustrated by block LC in FIG. 4.

As to the operation of this circuit 1, when the current $I_{OUT}$ absorbed by a load on the output terminal OUT is small, only stage 5, i.e., the stage with lowest transfer capacitance is enabled. The dynamic power consumption of the circuit 1 is, therefore, very low. The output voltage VOUT is held at a value preset by this stage 5.

Advantageously, when the clock signal to the stage 5 is provided by a VCO, with no absorption of output current IOUT, the charge pump of the stage 5 is operated at the lowest available frequency and consumes lowest power.

With the circuit 1 loadless, the voltage at the output terminal OUT is the highest available from the circuit 1. When the current $I_{OUT}$ absorbed from the load is other than zero, the stage 5, which is the only active one, senses a variation in the load that produces a decrease in the output voltage, and through the clock signal controlled by the VCO, raises its frequency to compensate for the current change.

In practice, this single charge pump of the stage 5 operates in the example illustrated on the charge pump adjustment principle using the drive signal frequency.

As the current $I_{OUT}$ increases again, the control circuit enables one or more of the stages 2, 3, 4 according to the magnitude of the current $I_{OUT}$.

Of course, each module that is activated involves some loss, so that the smaller the number of modules that are turned on, the less the power used up in the circuit 1.

As is evinced from Equation (1) when applied to each elementary charge pump stage, once n, $f$ and $V_{DD}$ are set, for each value of the output current $I_{OUT}$ there will be a transfer capacitance value $C_T$ at which the output voltage $V_{OUT}$ reached by the charge pump equals the voltage $V_{REG}$ to which the output terminal OUT need to be raised. More precisely, when the current $I_{OUT}$ is small, a small capacitance value $C_T$ of the transfer capacitor will suffice (for the same $f$), i.e., a small transfer capacitor will suffice having a small parasitic capacitance $C_{PAR}$ associated therewith. Consequently, the current absorbed by the supply reference will be reduced.

According to one embodiment of the invention, only such stages as are necessary for the circuit 1 to perform correctly may be actuated.

In summary, according to an embodiment of the invention a plurality of stages may be connected in parallel, with each stage including at least one charge pump with transfer capacitors of different sizes. According to the current $I_{OUT}$ being delivered to the load, the stage in the circuit 1 is activated whose charge pump has the most appropriate transfer capacitance. Also, when m is the number of stages employed in the circuit 1, by activating j (where j varies between 1 and m) stages simultaneously instead of one at a time, the output voltage can be a finely adjusted value. In other words, the control circuit 6 operates activating, according to the value of the current $I_{OUT}$, the connection of a charge pump combination to the output.

The activation of one or more charge pumps implies the overall output resistance of the circuit 1 varying as shown in FIG. 3. Thus, by programming the elementary charge pumps in the stages 2, 3, 4 and, hence, the overall output resistance, the number of charge pumps kept working at any one time, and the dynamic power dissipated through the whole circuit; can be minimized.

In the example shown in FIGS. 4 and 5, there are only seven elementary charge pump combinations possible, requiring six comparators in the analog/digital converter 7.

Figure 7:
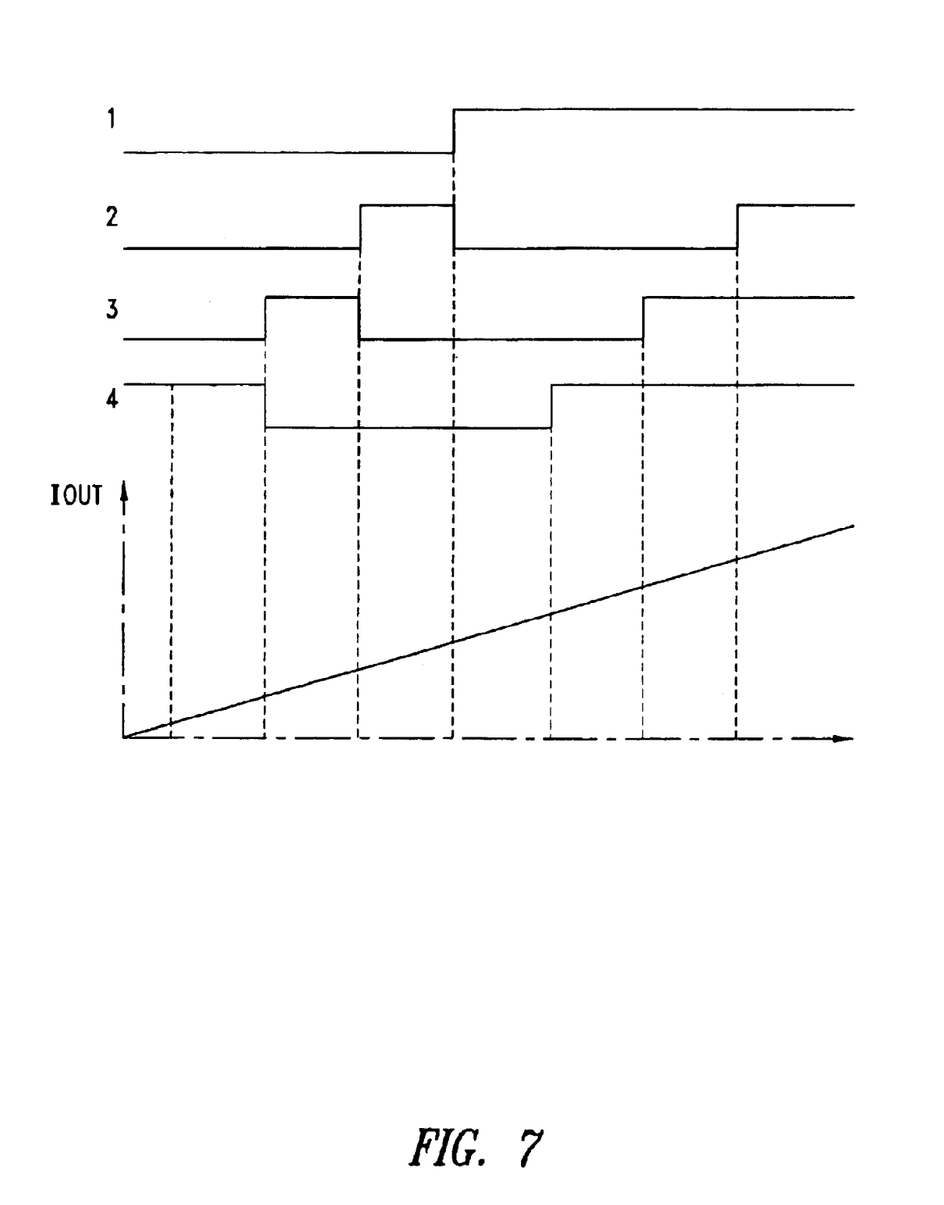
FIG. 7 shows a qualitative time graph of the activating signals to four stages of the charge pump circuit embodiment of this invention, plotted against the current absorbed from the load connected to the circuit.

FIG. 7 illustrates a possible actuation sequence for the four stages 2, 3, 4, 5 of the circuit 1 in the embodiment of FIGS. 4 and 5, against the current absorbed from the load connected to the circuit 1 of this invention.

Nothing prevents any of the combinations of elementary charge pumps possible in the stages 2, 3, 4, 5 can be activated. For example, to best utilize the binary weighing strategy adopted for the four stages with charge pumps, there may be provided no more than fifteen comparators in the analog-to-digital converter 7

Figure 6:
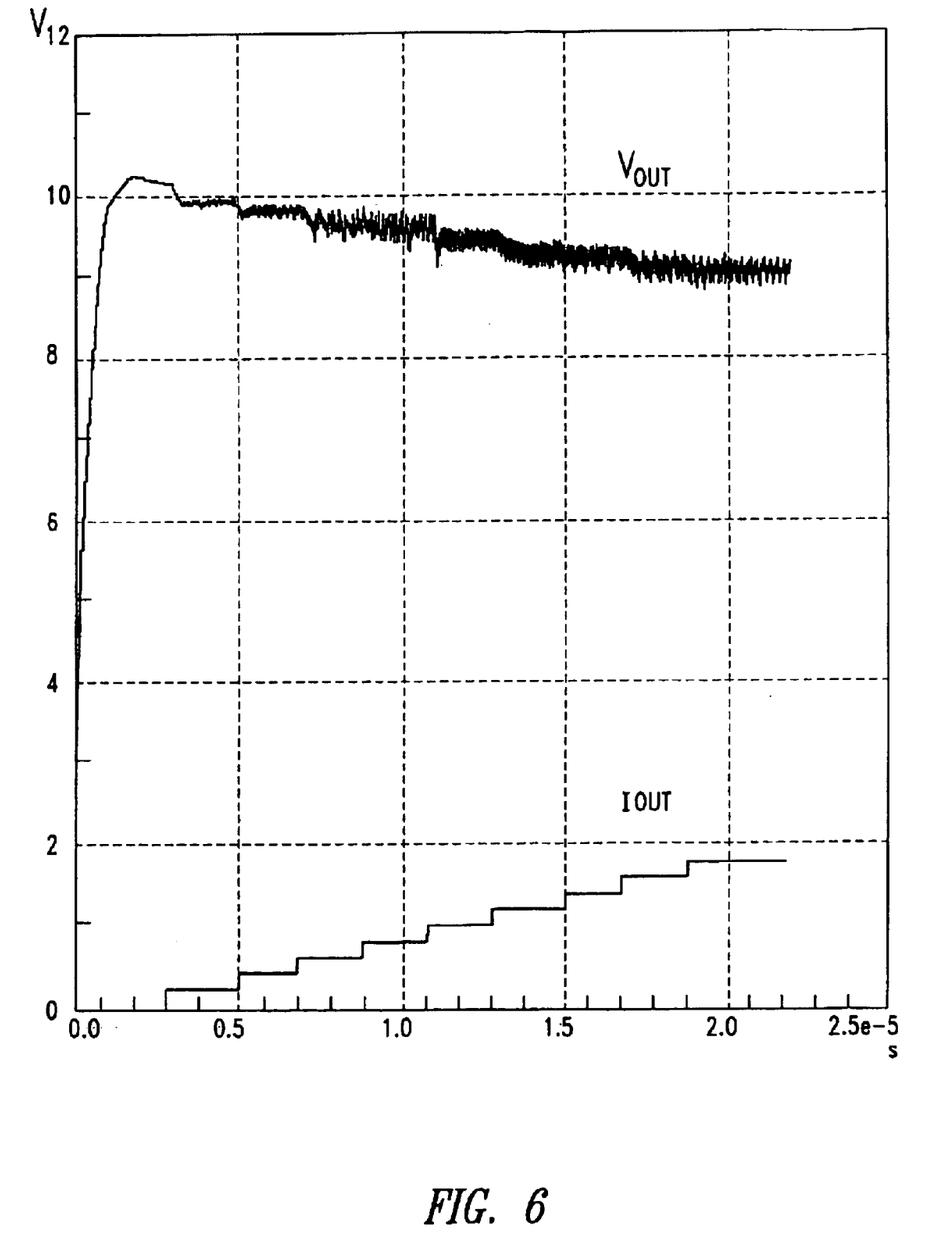
FIG. 6 shows a time graph of the output voltage from the circuit of this invention, plotted against the current absorbed from a load connected to the circuit.

FIG. 6 is a simulation graph of the circuit output voltage $V_{OUT}$ against the current $I_{OUT}$ absorbed from the load. In the simulation, the load was an ideal voltage-driven current generator. As can be seen, in going from an output current $I_{OUT}$ equal 0 to an output current $I_{OUT}$ equal 1.8 mA; the output voltage $V_{OUT}$ of the circuit 1 varies by the range of 1 Volt.

In particular, when the current $I_{OUT}$ equals 0 mA, only stage 5 is enabled in the circuit 1 of this invention, with the loadless voltage of the circuit 1 at the maximum loadless voltage value $V_{OUT,MAX}$. As the current $I_{OUT}$ begins to rise, i.e., the current demand from the load increases, one or more of the stages 2, 3, 4 are actuated in the circuit 1 to keep the output voltage $V_{OUT}$ substantially constant. A small voltage drop can be observed in the output voltage $V_{OUT}$ where the current $I_{OUT}$ rises.

To summarize, the device of one embodiment of this invention affords:

a large reduction in the current absorbed from the system under a condition of a small or no load current being delivered, meaning less power used up by the power supply;

quick response to manifest variations of considerable magnitude in the current absorbed from the load, since in this invention, one or more charge pumps are always kept operating to maintain the charge on the internal nodes of the circuit;

a smaller number of charge pump circuit switchings, making for improved efficiency of the circuit;

freedom to choose from different types of charge pumps, e.g., Dickson-type charge pumps, for use in the system.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention and can be made without deviating from the spirit and scope of the invention.

These and other modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A charge pump circuit connected between a first voltage reference and an output terminal, the charge pump circuit comprising:

at least two stages, each stage including an elementary charge pump circuit and being connected between said first voltage reference and said output terminal, each stage further including a control terminal to respectively select each stage; and adjustment circuitry connected between said output terminal and respective control terminals of said at least two stages, including a converter circuit to generate logic signals based on a current at the output terminal, wherein the elementary charge pump circuit of each stage has transfer capacitors with different capacitances from the other stages.

2. A charge pump circuit according to claim 1 wherein one of said at least two stages is activated or deactivated during circuit operation by said adjustment circuitry as a value of the current on said output terminal varies under application of an external load.

3. A charge pump circuit according to claim 1 wherein a combination of said at least two stages is activated or deactivated during circuit operation by said adjustment circuitry as a value of the current absorbed by an external load varies on said output terminal.

4. A charge pump circuit according to claim 1 wherein the elementary charge pump circuit of each stage has transfer capacitors whose capacitance values are multiples of a smallest capacitance value found within any of the stages.

5. A charge pump circuit according to claim 1 wherein at least one of the stages comprises a charge pump with a variable clock signal.

6. A charge pump circuit according to claim 5 wherein said variable clock signal is generated by a voltage-controlled oscillator driven by said charge pump.

7. A charge pump circuit according to claim 5 wherein said charge pump with the variable clock signal comprises transfer capacitors of least capacitance compared to capacitances of transfer capacitors in another of said at least two stages.

8. A charge pump circuit according to claim 3 wherein said adjustment circuitry comprises selection logic and an analog-to-digital converter, connected in cascade together between said output terminal and said plurality of stages.

9. A method of generating a substantially constant voltage signal of a higher value than a supply voltage reference, the method comprising:

generating said voltage signal to an output terminal using a charge pump circuit, said charge pump circuit comprising a plurality of stages, with each stage including an elementary charge pump circuit, said stages being connected parallely with each other;

determining a value of a current absorbed from a load connected to said output terminal;

generating logic signals based on the determined value of the absorbed current; and selectively actuating said stages in response to the generated logic signals and according to the determined value of said absorbed current, wherein only one of said stages is actuated when said determined current value is zero, and that a combination of said stages is actuated when said determined current value is other than zero.

10. A method of generating a voltage signal according to claim 9 wherein said stages are actuated selectively by adjustment circuitry connected between said output terminal and respective control terminals of said stages.

11. A method of generating a voltage signal according to claim 10 wherein each stage is driven by a respective clock signal from plural clock signals, each of the plural clock signals being different from the other clock signals by at least frequency.

12. A method of generating a substantially constant voltage signal of a higher value than a supply voltage reference, the method comprising:

generating said voltage signal to an output terminal using a charge pump circuit, said charge pump circuit comprising a plurality of stages, with each stage including an elementary charge pump circuit, said stages being connected parallely with each other;

determining a value of a current absorbed from a load connected to said output terminal;

generating logic signals based on the determined value of the absorbed current; and selectively actuating said stages in response to the generated logic signals and according to the determined value of said absorbed current, wherein the elementary charge pump circuit of each stage has transfer capacitors of different capacitances from the other stages.

13. An apparatus, comprising:

a plurality of stages coupled in parallel between a voltage reference and an output terminal, at least some of the stages including a charge pump circuit; and a control circuit coupled between the output terminal and an input terminal of each stage to control activation of the at least some of the stages, the control circuit including selection logic to selectively activate or deactivate at least one of these stages according to a current that varies at the output terminal under different load conditions, the control circuit further including a converter to cooperate with the selection logic to generate logic signals based on the current at the output terminal, wherein the charge pump circuit of the at least some of the stages includes a capacitor having a different capacitance than capacitors of other stages.

14. An apparatus, comprising:

a plurality of stages coupled in parallel between a voltage reference and an output terminal, at least some of the stages including a charge pump circuit; and a control circuit coupled between the output terminal and an input terminal of each stage to control activation of the at least some of the stages, the control circuit including selection logic to selectively activate or deactivate at least one of these stages according to a current that varies at the output terminal under different load conditions, the control circuit further including a converter to cooperate with the selection logic to generate logic signals based on the current at the output terminal, wherein at least one stage having the charge pump circuit includes a charge pump circuit with a variable clock signal generated by a voltage-controlled oscillator.

15. A method, comprising:

determining a value of a current absorbed by a load at an output terminal;

generating logic signals to selectively activate at least one of parallel stages of a charge pump circuit based on the determined value of the current;

generating a substantially constant output voltage, of a higher value than a supply voltage, based on the selectively activated at least one stage;

providing the generated output voltage to the load; and driving the stages by a respective one of plural clock signals, each clock signal different from each other by at least frequency.

16. The method of claim 15, further comprising:

activating only one of the stages if the determined value of the current is substantially zero; and activating a combination of the stages if the detected value of the current is other than substantially zero.

17. A charge pump circuit connected between a first voltage reference and an output terminal, the charge pump circuit comprising:

at least two stages, each stage including an elementary charge pump circuit and being connected between said first voltage reference and said output terminal, the elementary charge pump circuit of each stage having at least one transfer capacitor with a different capacitance from a capacitor of another stage; and adjustment circuitry connected between said output terminal and respective control terminals of said at least two stages, wherein the at least one capacitor has a capacitance that is a multiple of a smallest capacitance value found within any of the stages.

18. A charge pump circuit connected between a first voltage reference and an output terminal, the charge pump circuit comprising:

at least two stages, each stage including an elementary charge pump circuit and being connected between said first voltage reference and said output terminal, at least one of the stages having a charge pump circuit with a variable clock signal and having transfer capacitors of least capacitance compared to capacitances of transfer capacitors in another stage; and adjustment circuitry connected between said output terminal and respective control terminals of said at least two stages.

19. A method of generating a substantially constant voltage signal of a higher value than a supply voltage reference, the method comprising:

generating said voltage signal to an output terminal using a charge pump circuit, said charge pump circuit having a plurality of parallel stages, with each stage including an elementary charge pump circuit, the elementary charge pump circuit of each stage having transfer capacitors of different capacitances from other stages;

determining a value of a current absorbed from a load connected to said output terminal; and selectively actuating said stages according to the determined value of said absorbed current.

20. A apparatus for generating a substantially constant voltage signal of a higher value than a supply voltage reference, the apparatus comprising:

a means for generating said voltage signal to an output terminal using a charge pump circuit, said charge pump circuit having a plurality of parallel stages, with at least one stage including an elementary charge pump circuit, the elementary charge pump circuit of that stage having a transfer capacitor of different capacitance from capacitors of other stages;

a means for determining a value of a current absorbed from a load connected to said output terminal;

a means for selectively actuating said stages according to the determined value of said absorbed current; and a means for using a binary-weighting strategy to determine capacitances for each of the stages.

21. The apparatus of claim 20 wherein each of the stages includes an elementary charge pump circuit.

* * * * *